United States Patent
Shin

(10) Patent No.: US 7,095,595 B2
(45) Date of Patent: Aug. 22, 2006

(54) HARD DISK DRIVE COMPRISING FLEXIBLE PRINTED CIRCUIT WITH DAMPING MATERIAL

(75) Inventor: Sang-chul Shin, Osan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/288,507

(22) Filed: Nov. 6, 2002

(65) Prior Publication Data

US 2003/0086214 A1  May 8, 2003

(30) Foreign Application Priority Data

Nov. 6, 2001  (KR) .............................. 2001-68818

(51) Int. Cl.
*G11B 5/55* (2006.01)
(52) U.S. Cl. .................................................. 360/266.3
(58) Field of Classification Search ............. 360/266.3, 360/245.9, 246
See application file for complete search history.

(56) References Cited

U.S. PATENT DOCUMENTS

| | | | | |
|---|---|---|---|---|
| 4,819,094 A | * | 4/1989 | Oberg ...................... 360/245.9 |
| 4,823,217 A | * | 4/1989 | Kato et al. ................ 360/246.8 |
| 5,245,489 A | * | 9/1993 | Kimura et al. ........... 360/264.2 |
| 5,384,432 A | * | 1/1995 | Noro et al. ............. 174/117 FF |
| 5,552,209 A | | 9/1996 | McCutcheon ................ 428/209 |
| 5,717,541 A | * | 2/1998 | Ycas et al. ............... 360/97.01 |
| 5,883,759 A | * | 3/1999 | Schulz ..................... 360/245.9 |
| 6,201,664 B1 | * | 3/2001 | Le et al. ................... 360/244.9 |
| 6,282,064 B1 | * | 8/2001 | Palmer et al. ........... 360/245.9 |
| 6,459,043 B1 | * | 10/2002 | Dodsworth ................. 174/254 |
| 6,563,676 B1 | * | 5/2003 | Chew et al. ............. 360/264.7 |

FOREIGN PATENT DOCUMENTS

| JP | 5-74070 | * | 3/1993 |
|---|---|---|---|
| JP | 8-287625 | | 1/1996 |
| JP | 8-287625 | * | 11/1996 |
| JP | 08287625 | * | 11/1996 |
| JP | 10-503622 | | 3/1998 |
| JP | 10-134529 | | 5/1998 |
| JP | 2001-52360 | | 2/2001 |

OTHER PUBLICATIONS

Machine Translation of JP 5-74070, "Magnetic Head Positioning Mechanism", published Mar. 26, 1993.*

* cited by examiner

*Primary Examiner*—Angel Castro
(74) *Attorney, Agent, or Firm*—Staas & Halsey LLP

(57) ABSTRACT

A hard disk drive including a flexible printed circuit (FPC) in which a base layer and a cover layer are arranged with a circuit layer therebetween. In addition, a damping material is coupled at a predetermined portion of the signal patterns in the circuit layer so as to cross the signal patterns. The hard disk drive reduces vibration energy over an entire frequency band to minimize the effect of vibration on servo control and improve the performance of the hard disk drive.

16 Claims, 7 Drawing Sheets

HARD DISK DRIVE COMPRISING FLEXIBLE PRINTED CIRCUIT WITH DAMPING MATERIAL

CROSS-REFERENCE TO RELATED APPLICATIONS

This application claims the benefit of Korean Application No. 2001-68818, filed Nov. 6, 2001, in the Korean Intellectual Property Office, the disclosure of which is incorporated herein by reference.

BACKGROUND OF THE INVENTION

1. Field of the Invention

The present invention relates to a flexible printed circuit (FPC), and more particularly, to an FPC to minimize vibration energy of noise.

2. Description of the Related Art

A hard disk drive is an auxiliary memory device of a computer to write and read information on a magnetic disk by using a magnetic head operating as an electromagnet.

FIG. 1 illustrates the structure of a conventional hard disk drive 20. Referring to FIG. 1, the conventional hard disk drive comprises: a disk 13 to store information; a spindle motor 15 to rotate the disk 13; an actuator 23 having a magnetic head 25 to write and reproduce information on and from the disk 13; a voice coil motor 21 to drive the actuator 23; a flexible printed circuit (FPC) 11 to transfer electrical signals from a printed circuit board (PCB) (not shown) to the actuator 23; and a bracket 31 to support the FPC 11.

The disk 13 is formed of a parking zone micro-processed by a laser at an inner region of the disk 13 and a data zone at the outer circumference of the parking zone, on which magnetic signals are written. In this case, the parking zone is coupled with the spindle motor 15 to mount the magnetic head 25 in a power-off state. Servo signals to report the location of information to be written are pre-written on tens of thousands of tracks along the circular shape of the disk 13.

The actuator 23 includes a fantail unit 19 having the voice coil motor 21 to drive the actuator 23; a pivot bearing 17 at the center of rotation of the actuator 23; and the magnetic head 25 having a write head to write data on the disk 13 and a read head to reproduce information from the disk 13.

The PCB transfers electrical signals to the FPC 11 and the FPC 11 transfers the electrical signals to the actuator 23. The electrical signals are transferred from the actuator 23 to the voice coil motor 21. The actuator 23 is rotated centering upon the pivot bearing 17 by electromagnetic force from interaction between current and magnets in the voice coil motor 21. Accordingly, the actuator 23 moves from the parking zone to the data zone.

FIG. 2 illustrates the structure of the conventional FPC 11. Referring to FIG. 2, head signal patterns RDX; Read Data X, RDY; Read Data Y, WDX; Write Data X, and WDY; Write Data Y to transfer and/or receive the electrical signals to and from the magnetic head through a pre-amplifier (not shown), voltages VDD; positive DC supply and VSS; negative DC supply to supply voltage to the pre-amplifier, a ground GND to ground, and a current pattern VC; Voice coil to apply the current to the voice coil motor 21 are arranged on the conventional FPC 11.

In the case of writing and/or reading data on the hard disk drive 20, the magnetic head 25 moves along the tracks of the disk 13 to write and/or read data. It is most preferable that the rotating track of the disk 13 forms an exact circle, and the magnetic head 25 precisely writes and reads data. However, in reality, the disk 13 rotates in a distorted circle caused by vibration of the spindle motor 15. Accordingly, a runout occurs, in which there is a difference between the locations of the track and the magnetic head.

Two kinds of runout include repeatable runout (RRO), which repeats every rotation and non-repeatable runout (NRRO), which does not repeat every rotation.

The RRO means the rotation of the disk 13 to form a waveform with a specific period caused by the assembly deflection of the disk 13 or the vibration of the hard disk drive 20. Since the waveform is repeated periodically, differences in location between the track and the magnetic head 25 can be compensated for by recording waveform information in a servo memory.

In order to compensate for the RRO and test reliability, a burn-in test is performed during the manufacturing process of the hard disk drive by varying conditions such as temperature and voltage. However, it is difficult to completely compensate for the RRO because various factors like FPC bias, windage bias, and heat complicatedly operate in the manufacturing process. The FPC bias means the force applied from the FPC to a head stack assembly (HSA) mechanically. The windage bias means the force applied to the HSA according to the effect from rotating fluctuation of the disk to the FPC.

In the FPC 11, since the head signal patterns RDX, RDY, WDX, and WDY are physically close to the current pattern VC and the voltage patterns VDD and VSS, through which a relatively large current flows, noise affects the head signal patterns RDX, RDY, WDX, and WDY. In addition, a low frequency of about 340 Hz caused by the natural frequency of the FPC 11 affects servo control.

In particular, since the write head signal patterns WDX and WDY are nearer to the voltage patterns VDD and VSS and the current pattern VC than the read head signal patterns RDX and RDY, the effects are much more serious in a write mode than in a read mode.

Consequently, since the compensation values for the RRO vary according to the operating environment and the kind of hard disk drive, the performance of hard disk drives is affected by disturbances like NRRO and low frequencies of under 1 kHz, which are not servo control frequencies of the FPC. NRRO indicates the rotation of the disk to form a distorted waveform without a specific period.

Referring to FIG. 3, a frequency response graph of the conventional FPC illustrates current strength peaks at around 340 Hz and 750 Hz. Moreover, the peaks are repeated at radio frequencies above 1 kHz. Since the natural frequencies of the conventional FPC are located at the frequency bands 340 Hz and 750 Hz, resonance occurs between the natural frequencies of the FPC and noise. Consequently, the vibration energy at the frequency bands is relatively strong, thereby generating the peaks.

As described above, in a conventional hard disk drive, seek time, which means the time to seek a track, and position error signal (PES) are increased by the noise effect from the current pattern VC and the voltage patterns VDD and VSS, by the difference between compensation values of the RRO, and by the effect from the low frequency noise. As a result, the performance and yield rate of the conventional hard disk drive is deteriorated.

SUMMARY OF THE INVENTION

Accordingly, it is an object of the present invention to provide a hard disk drive having an improved flexible printed circuit (FPC) to minimize vibration energy over the entire frequency band generated in the FPC, especially at a low frequency band of under 1 kHz, thereby minimizing the effects on servo control.

Additional objects and advantages of the invention will be set forth in part in the description which follows and, in part, will be obvious from the description, or may be learned by practice of the invention.

The foregoing and other objects of the present invention are achieved by providing a hard disk drive having an actuator with a magnetic head to write and read information to/from a disk, a voice coil motor to drive the actuator, a flexible printed circuit (FPC) to transfer electrical signals to the actuator and the voice coil motor, and a bracket to support the FPC, the hard disk drive comprises: the FPC having a base layer and a cover layer arranged with a circuit layer therebetween; and a damping material coupled at predetermined portion(s) of signal patterns on the circuit layer and crossing the signal patterns.

It is an aspect of the invention that the predetermined portion is a starting portion of non-contact between the FPC and the bracket or between the FPC and the actuator.

It is another aspect of the invention that the predetermined portions are a starting portion of non-contact between the FPC and the bracket and a starting portion of non-contact between the FPC and the actuator.

It is yet another aspect of the invention that the damping material is formed between the base layer and the cover layer and is coupled with an upper or lower portion of the circuit layer.

It is yet another aspect of the invention that the damping material is formed between the base layer and the cover layer and is being coupled with the upper and lower portions of the circuit layer.

In this case, the damping material is coupled with the signal patterns of the circuit layer and is perpendicular to the signal patterns.

In the hard disk drive according to the present invention, a damping material is stacked and adhered to a predetermined portion of the signal patterns in a circuit layer to minimize the vibration energy over the entire frequency band that the FPC can generate. In particular, the vibration energy at a low frequency band of under 1 kHz, which is not a servo control range, is reduced so as to minimize the effect on servo control.

In the hard disk drive according to an aspect of the present invention, since a frequency element over 1 kHz in the servo control range is compensated for by using a notch filter, noise at a frequency band of over 1 kHz does not affect the servo control much.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF THE INVENTION

Figure 1:
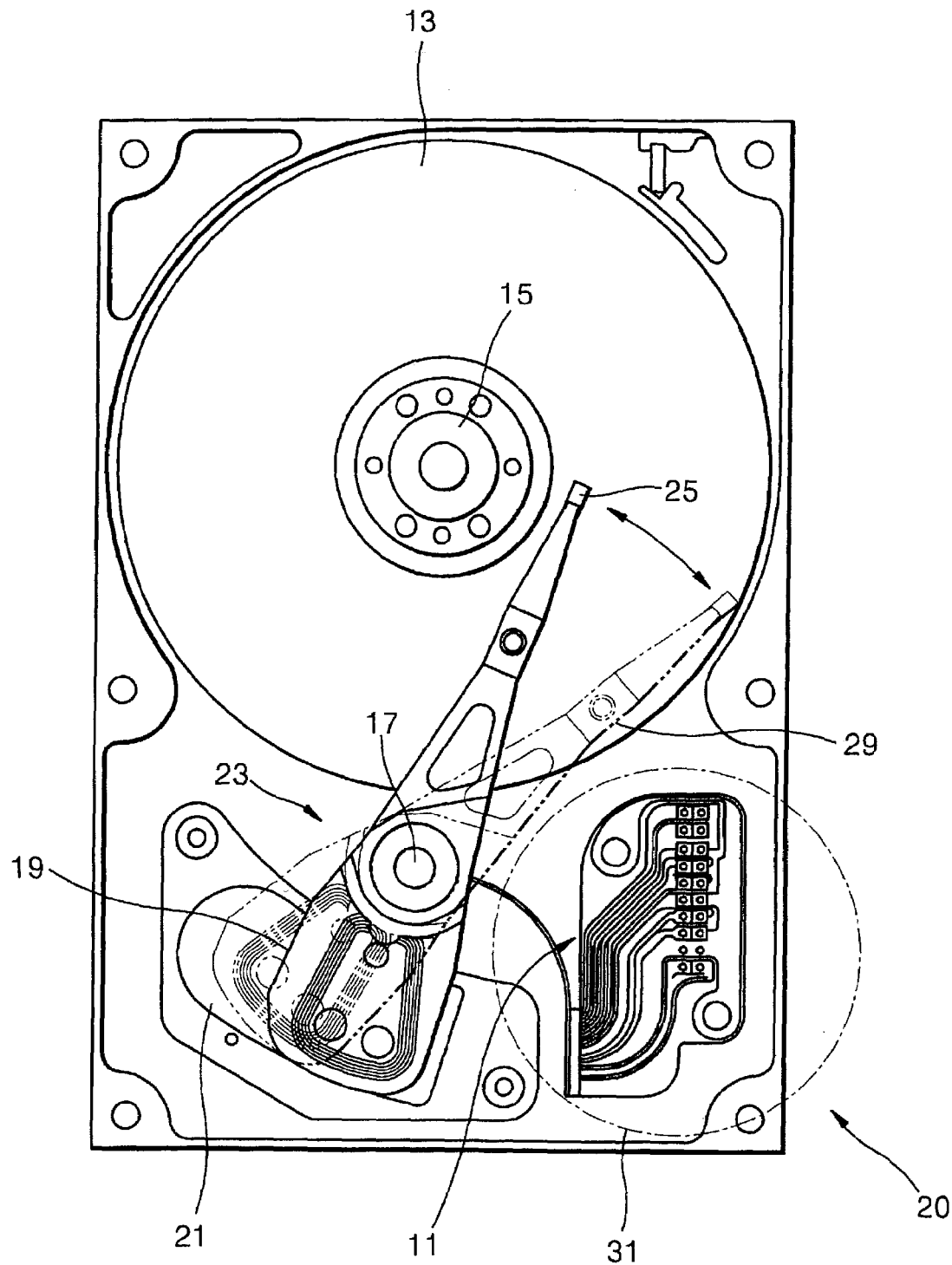
FIG. 1 is a plane view illustrating a conventional hard disk drive.
Figure 2:
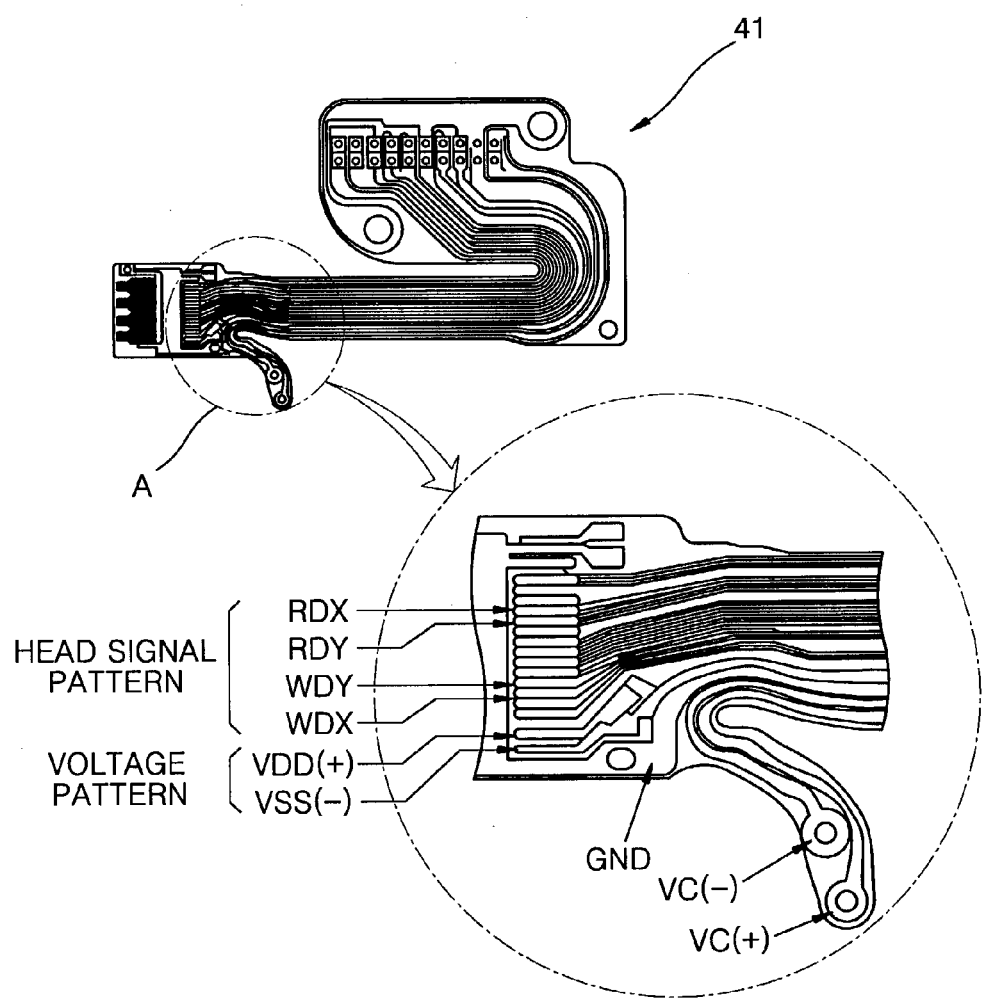
FIG. 2 is a plane view illustrating a conventional flexible printed circuit (FPC)

A flexible printed circuit (FPC) according to an embodiment of the present invention will be fully described referring to the attached drawings. The same reference numerals in different drawings represent the same element, and thus their description will be omitted.

Figure 4:
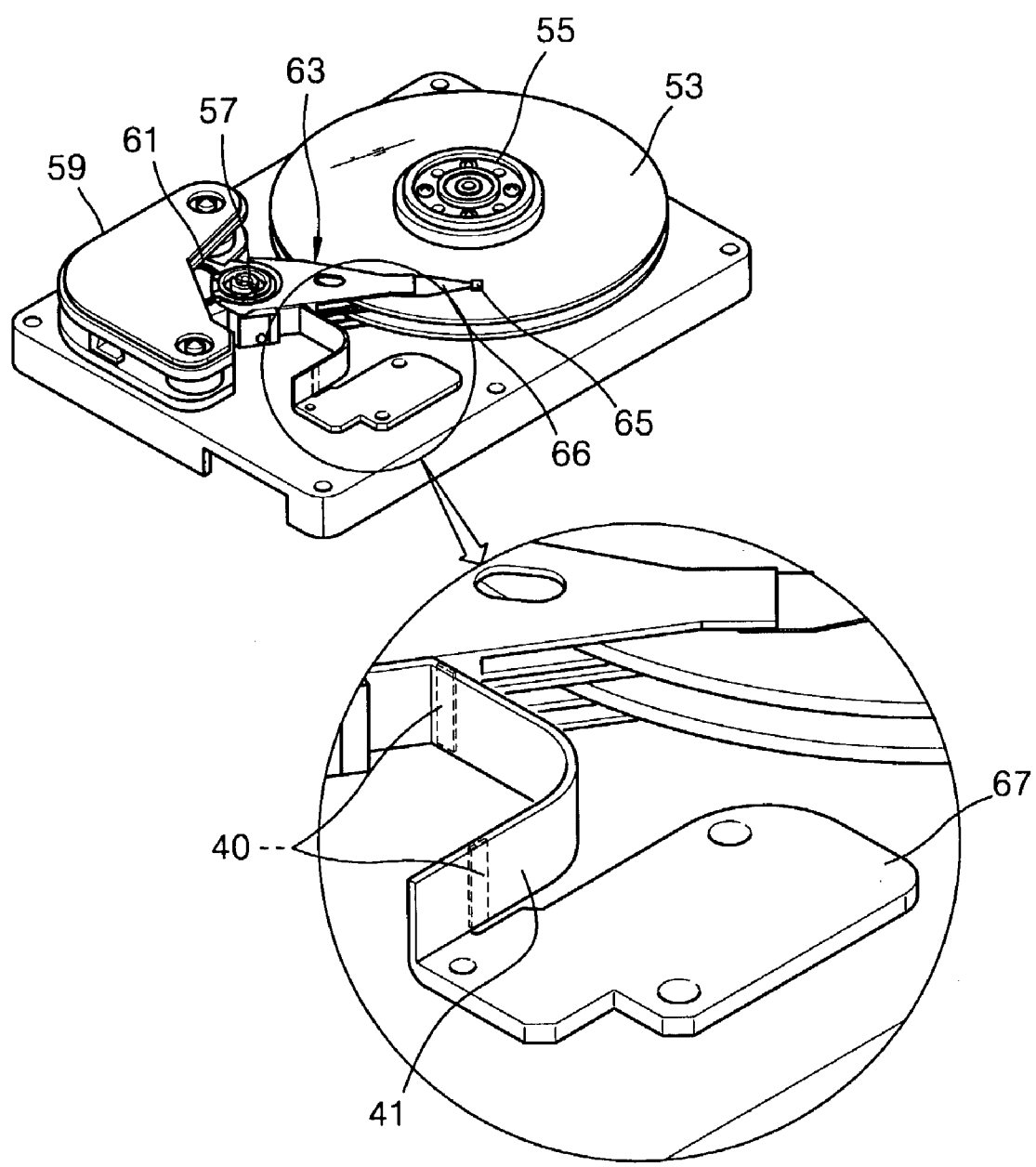
FIG. 4 is a perspective view of a hard disk drive according to an embodiment of the present invention.

FIG. 4 illustrates a hard disk drive according to an embodiment of the present invention. Referring to FIG. 4, the hard disk drive comprises: an actuator 63 having a magnetic head 65 to write and/or read information to/from a disk 53; a voice coil motor 61 to drive the actuator 63; an FPC 41 having a base layer 45 and a cover layer 43 with a circuit layer 47 therebetween to transfer electrical signals to the actuator 63 and the voice coil motor 61, and having a damping material 40 coupled to a predetermined portion of the signal patterns of the circuit layer 47 in crossing the signal patterns; and a bracket 67 to support the FPC 41.

The FPC 41 fixed to the bracket 67 connects a printed circuit board (PCB) (not shown) to the actuator 63 to transfer the electrical signals. The FPC 41 is formed in a triple-layer stack structure having the base and cover layers 45 and 43 and the circuit layer 47 therebetween. Head signal patterns RDX, RDY, WDX, and WDY, the voltage patterns VDD and VSS, the ground pattern GND, and a current pattern VC are arranged on the FPC 41.

A suspension 66 supporting the magnetic head 65 facing the disk 53 is located at one end of the actuator 63, and the voice coil motor 61 is located at the opposite end of the actuator 63. Consequently, the actuator 63 is driven according to the interaction between current signals transferred from the FPC 41 and the magnetic field of the magnets. The actuator 63 is rotated centering upon a pivot shaft 57 by the rotation of the voice coil motor 61, thereby moving the magnetic head 65 to a predetermined location.

When power is applied to the hard disk drive, a spindle motor 55 is rotated to rotate the disk 53, which is mounted on the spindle motor 55. When the rotation speed of the disk 53 reaches a predetermined value, the magnetic head 65 floats above the disk 53 by pneumatic pressure between the disk 53 and the magnetic head 65. In this case, a fine gap is maintained between the magnetic head 65 and the disk 53. The electrical signals transferred from the PCB pass through the FPC 41 and are transferred to the actuator 63 and the voice coil motor 61, thereby driving the actuator 63.

When moving toward a predetermined track, the magnetic head 65 reads a pre-written servo signal by using a read head to receive the electrical signals transferred from the FPC 41. Accordingly, the magnetic head 65 writes information on the disk 53 by using a write head or reads information from the disk 53 by using the read head and transfers the information to the PCB through the FPC 41.

The hard disk drive according to an aspect of the present invention includes the FPC 41 having the damping material to reduce vibration energy from noise over the entire frequency band, thereby minimizing the effect of noise on servo control.

Figure 5:
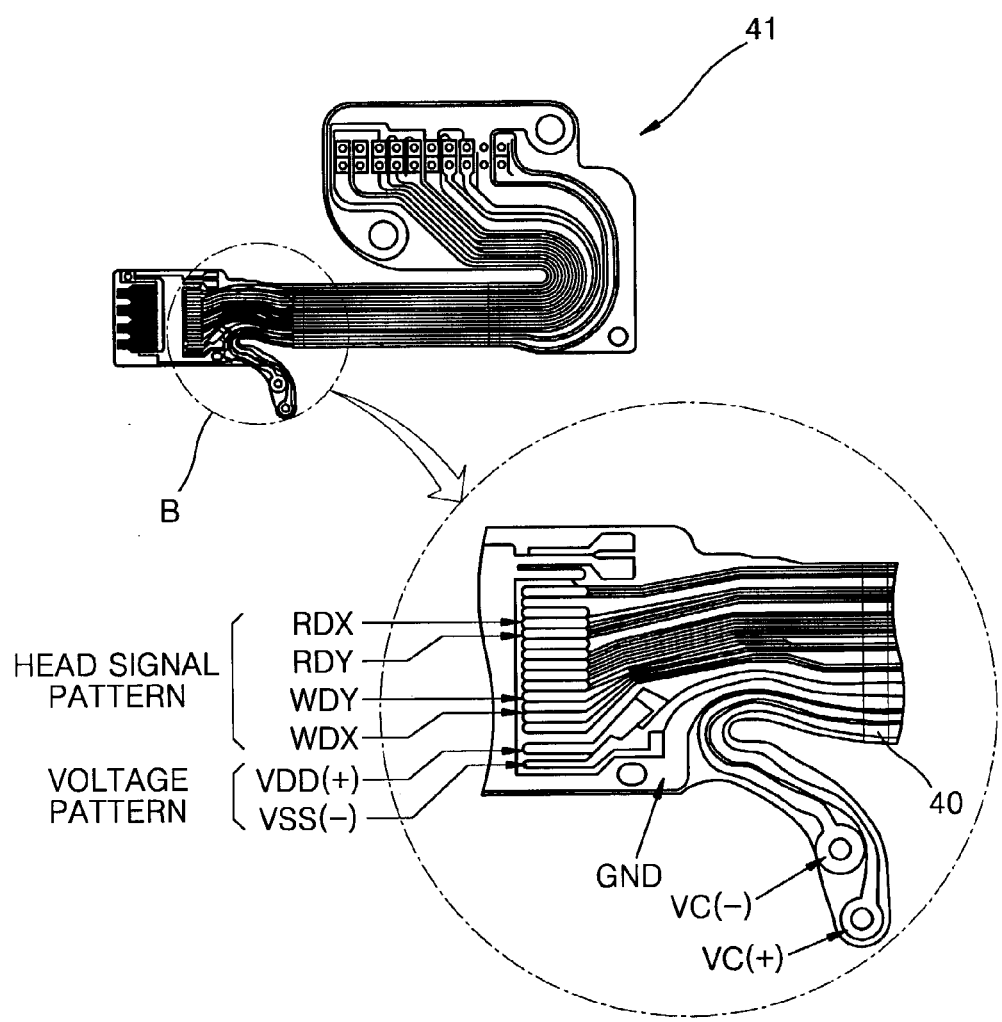
FIG. 5 is a plane view illustrating an FPC of the hard disk drive illustrated in FIG. 4.

FIG. 5 illustrates the structure of the FPC of the hard disk drive. Referring to FIG. 5, the FPC 41 uses the same pattern as the FPC of the conventional hard disk drive, except for the damping material 40 coupled at a predetermined portion of the circuit layer 47.

The damping material 40 is added to reduce the vibration energy at a frequency band centered around 340 Hz and to minimize the vibration energy at under 1 kHz, which is outside of the servo control range, so that the effect on the servo control is reduced. In this case, the vibration energy at a frequency band centered around 340 Hz causes problems in writing information on the disk 53 using the magnetic head 65, which receives the electrical signals through the FPC 41.

Figure 6A:
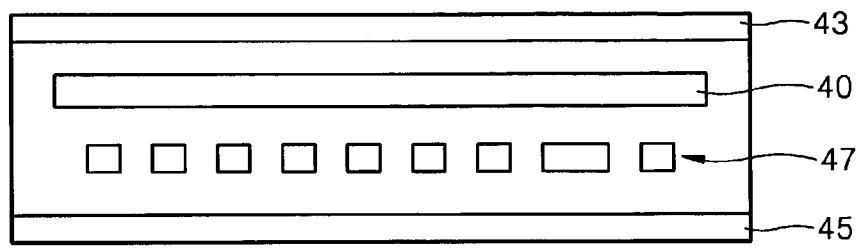
FIGS. 6A, 6B, and 6C are sectional views illustrating portions of damping materials adhered to the FPC of the hard disk drive] illustrated in FIG. 5.
Figure 6B:
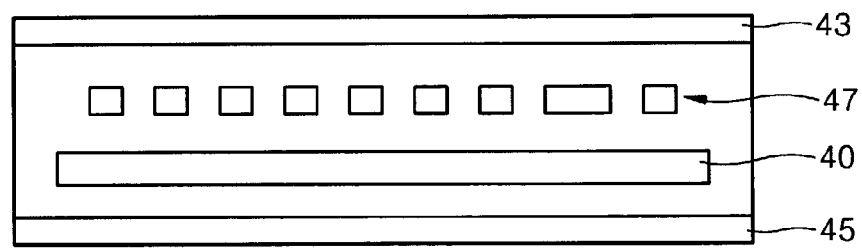
Figure 6C:
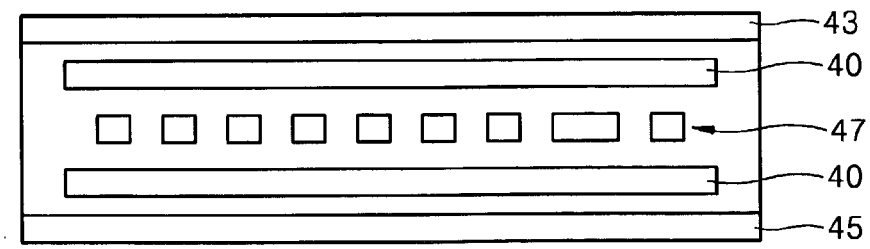

The damping material 40 is formed of polymer resin, which is stacked on the circuit layer as illustrated in FIGS. 6A, 6B, and 6C.

FIGS. 6A, 6B, and 6C illustrate sectional views of the coupled portions of the damping material 40 illustrated in FIG. 5.

Referring to FIG. 6A, the circuit layer 47 corresponding to each signal pattern is located between the cover layer 43 and the base layer 45 and is made of copper. Then, the damping material 40 is stacked on an upper portion of the circuit layer 47, and the cover layer 43 and the base layer 45 are adhered by using an adhesive, thus forming the FPC 41.

Referring to FIG. 6B, the circuit layer 47 corresponding to each signal pattern is located between the cover layer 43 and the base layer 45, by using copper. Then, the damping material 40 is stacked on a lower portion of the circuit layer 47, and the cover layer 43 and the base layer 45 are adhered by using an adhesive, thus forming the FPC 41.

FIG. 6C illustrates a structure of FPC using both structures of FPCs shown in FIGS. 6A and 6B. The circuit layer 47 corresponding to each signal pattern is located between the cover layer 43 and the base layer 45, by using copper. Then, the damping materials 40 are stacked on the upper and lower portions of the circuit layer 47, and the cover layer 43 and the base layer 45 are adhered using an adhesive, thus forming the FPC 41.

In an aspect of the invention, the damping material 40 is coupled at a starting portion of non-contact between the FPC 41 and the bracket 67, and a starting portion of non-contact between the FPC 41 and the actuator 63. In order to obtain a similar effect, the damping material 40 can be coupled at one end of aligned signal patterns in the circuit layer 47.

If the damping material 40 is coupled at a central portion of the aligned signal patterns in the circuit layer 47, other than an end portion, namely the starting portion of non-contact between the FPC 41 and the bracket 67 or between the FPC 41 and the actuator 63, the elasticity of the FPC 41 is remarkably increased. Consequently, the actuator 63 cannot promptly trace tracks and power consumption is increased, thereby deteriorating the performance of the hard disk drive.

In a case where the damping material 40 is adhered to the outside of the cover layer 43 or the base layer 45, not on the circuit layer 47, the adhesive between the damping material 40 and the FPC 41 may leak and cause contamination.

Accordingly, it is an aspect that the damping material 40 is coupled with the circuit layer 47 between the cover and base layers 43 and 45, at the starting portion of the FPC 41 and the bracket 67 or at the starting portion of the FPC 41 and the actuator 63.

In addition, it is an aspect that the damping material 40 is coupled with the circuit layer 47 by crossing the aligned signal patterns.

If the damping material 40 is coupled with the circuit layer 47 in parallel with the aligned signal patterns, the elasticity of the FPC 41 is increased, which reduces an area in which vibrations from outside are absorbed or the characteristic vibration of the FPC 41. Accordingly, the damping material 40 cannot efficiently absorb the vibration energy.

As a result, it is an aspect that the damping material 40 is coupled with the circuit layer 47 in crossing the signal patterns. It is another aspect that the damping material 40 is coupled with the circuit layer 47 of the FPC 41 at both ends of the aligned signal patterns and is perpendicular to the signal patterns.

Figure 7:
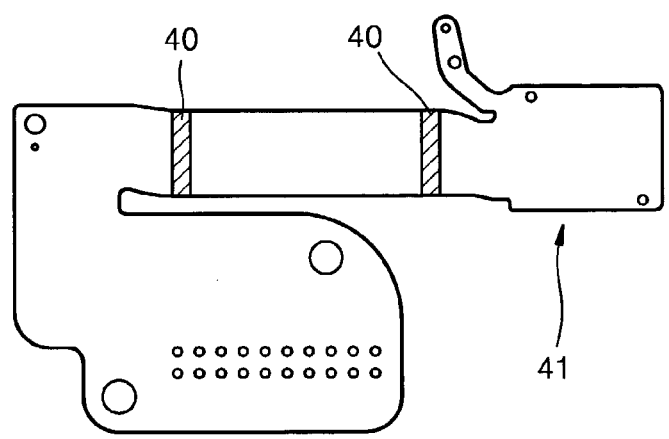
FIG. 7 illustrates the FPC of the hard disk drive according to an embodiment of the present invention.

FIG. 7 is a schematic illustration of the FPC 41 according to an embodiment of the present invention showing the coupled location of the damping material 40.

The FPC 41 having the damping material 40 reduces the vibration input to the FPC 41 in writing and/or reading information to/from the disk 53 by using the magnetic head 65. In this case, the vibration energy is reduced by adjusting the mass and strength of the FPC 41. This method can be used for a case having a small reduction range of the vibration energy. The damping material 40 disperses the vibration energy input to the FPC 41 and the vibration energy generated by the FPC 41, thereby reducing the vibration level.

Figure 3:
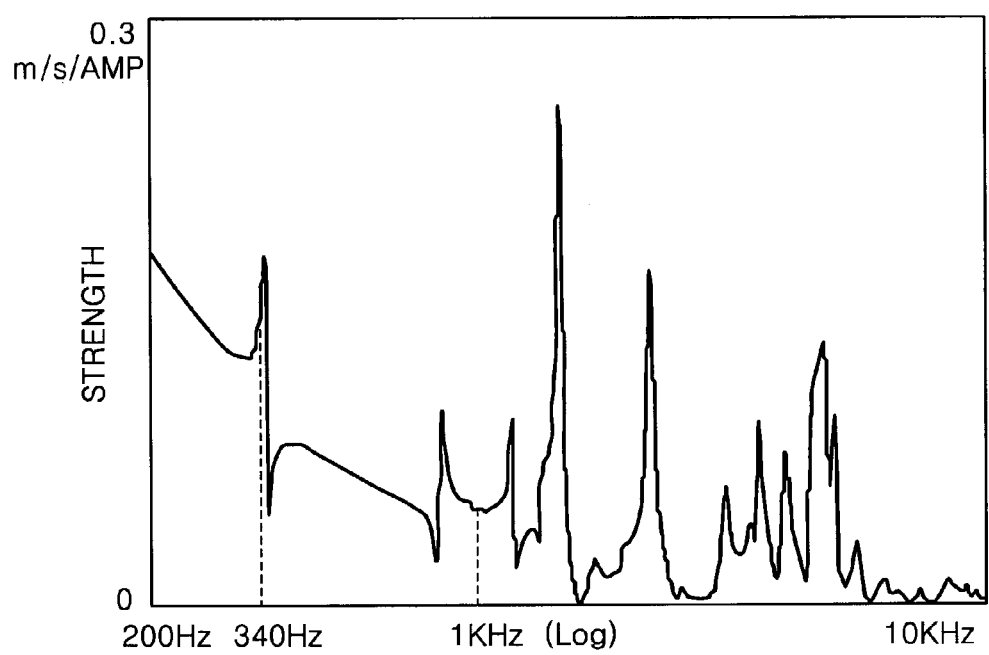
FIG. 3 is a graph illustrating the frequency response of the conventional FPC.
Figure 8:
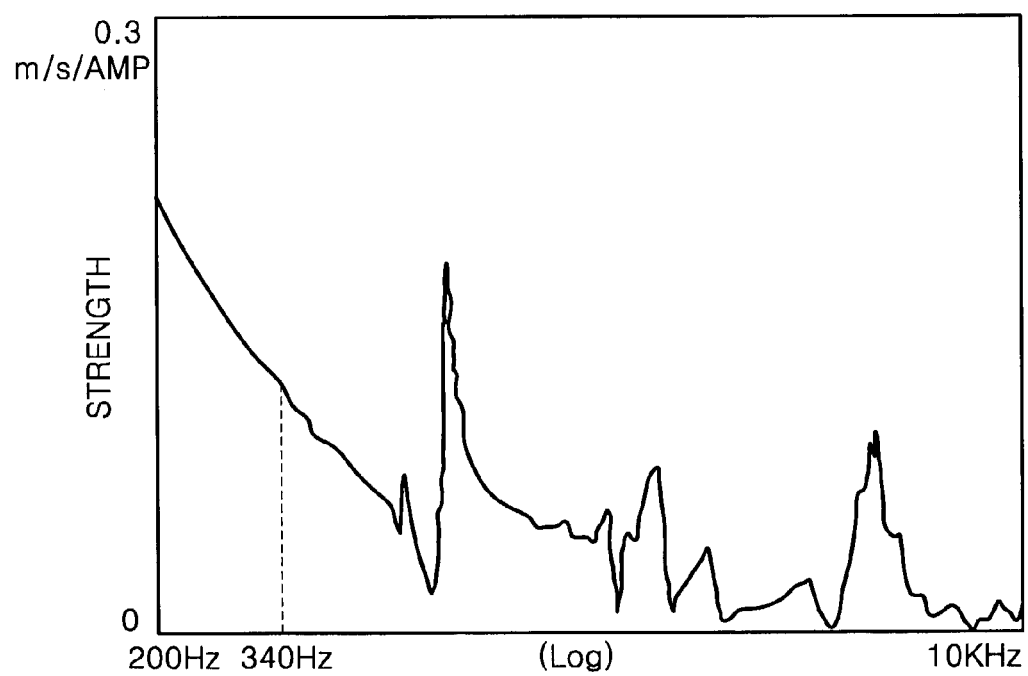
FIG. 8 is a graph illustrating the frequency response of the FPC of the hard disk drive illustrated in FIG. 4.

FIG. 8 illustrates a frequency response of the FPC of the hard disk drive illustrated in FIG. 4. Referring to FIG. 8, the peaks at 340 Hz and 750 Hz are remarkably reduced as compared to FIG. 3. Thus, the performance of the hard disk drive including the FPC having the damping material is improved.

The FPC according to an embodiment of the present invention includes the damping material coupled at the starting portion of non-contact between the FPC and the bracket or the starting portion of non-contact between the FPC and the actuator and crossing the signal patterns. Accordingly, the damping material absorbs the vibration energy from outside or the vibration energy caused by the characteristic frequency of the FPC. As a result, the seek time of the actuator is reduced and a position error is reduced to improve the performance of the hard disk drive.

It will be understood by those skilled in the art that various changes in form and details may be made therein. For example, the damping material can be coupled at other portions of the FPC for reducing the vibration energy.

As described above, the FPC according to the present invention reduces the vibration energy over the entire frequency band to minimize the effect of vibration energy on servo control. As a result, the performance of the hard disk drive is improved.

Although an embodiment of the present invention has been shown and described, it would be appreciated by those skilled in the art that changes may be made in this embodiment without departing from the principles and spirit of the invention, the scope of which is defined in the claims and their equivalents.

What is claimed is:

1. A hard disk drive having an actuator with a magnetic head to write and read information to/from a disk, a voice coil motor to drive the actuator, a flexible printed circuit (FPC) to transfer electrical signals to the actuator and the voice coil motor, and a bracket to support the FPC, the hard disk drive comprising:

the FPC having a base layer and a cover layer arranged with a circuit layer therebetween; and a damping material coupled at predetermined portion(s) of signal patterns on the circuit layer and crossing the signal patterns, wherein the damping material is added at a frequency band centered around 340 Hz to reduce vibration energy at under 1 kHz.

2. The hard disk drive of claim 1, wherein the predetermined portion is a starting portion of non-contact between the FPC and the bracket.

3. The hard disk drive of claim 2, wherein the damping material is coupled with the signal patterns of the circuit layer and is perpendicular to the signal patterns.

4. The hard disk drive of claim 1, wherein the predetermined portion is a starting portion of non-contact between the FPC and the actuator.

5. The hard disk drive of claim 4, wherein the damping material is coupled with the signal patterns of the circuit layer and is perpendicular to the signal patterns.

6. The hard disk drive of claim 1, wherein the predetermined portions are a starting portion of non-contact between the FPC and the bracket and a starting portion of non-contact between the FPC and the actuator.

7. The hard disk drive of claim 6, wherein the damping material is coupled with the signal patterns of the circuit layer and is perpendicular to the signal patterns.

8. The hard disk drive of claim 1, wherein the damping material is formed between the base layer and the cover layer and is being coupled with at least one of an upper and a lower portion of the circuit layer.

9. The hard disk drive of claim 8, wherein the damping material is coupled with the signal patterns of the circuit layer and is perpendicular to the signal patterns.

10. The hard disk drive of claim 1, wherein the damping material is coupled with the signal patterns of the circuit layer and is perpendicular to the signal patterns.

11. The hard disk drive of claim 1, wherein the damping material is formed of polymer resin.

12. A hard disk drive having an actuator to write and read information to/from a disk and a voice coil motor to drive the actuator, the hard disk drive further comprising:

a bracket connected to a printed circuit board (PCB); and a flexible printed circuit (FPC) formed of signal patterns and connected to the POB at one end through the bracket and to the actuator at the other end, wherein a damping material is coupled to a portion of the FPC along a length of the FPC between ends thereof next to a junction of the FPC and the bracket.

13. The hard disk drive of claim 12, wherein the damping material is formed of a polymer resin.

14. A hard disk drive comprising:

a flexible printed circuit (FPC) having first and second layers arranged with a circuit layer therebetween;

a damping material, located between the first and second layers, and coupled at predetermined portions of signal patterns on the circuit layer and crossing the signal patterns; and an adhesive adhering the first and second layers, wherein the damping material is added at a frequency band centered around 340 Hz to reduce vibration energy at under 1 kHz.

15. The hard disk drive of claim 14, wherein the damping material is coupled with the signal patterns of the circuit layer and is perpendicular to the signal patterns.

16. The hard disk drive of claim 14, wherein the damping material is formed of polymer resin.

* * * * *

UNITED STATES PATENT AND TRADEMARK OFFICE
CERTIFICATE OF CORRECTION

| | |
|---|---|
| PATENT NO. | : 7,095,595 B2 |
| APPLICATION NO. | : 10/288507 |
| DATED | : August 22, 2006 |
| INVENTOR(S) | : Sang-chul Shin |

It is certified that error appears in the above-identified patent and that said Letters Patent is hereby corrected as shown below:

Column 8, Line 9, change "POB" to --PCB--.

Signed and Sealed this

Thirteenth Day of February, 2007

JON W. DUDAS
*Director of the United States Patent and Trademark Office*